US010594293B2

(12) United States Patent
Park et al.

(10) Patent No.: US 10,594,293 B2
(45) Date of Patent: Mar. 17, 2020

(54) FILTER INCLUDING BULK ACOUSTIC WAVE RESONATOR

(71) Applicant: SAMSUNG ELECTRO-MECHANICS CO., LTD., Suwon-si (KR)

(72) Inventors: Yoon Sok Park, Suwon-si (KR); Jung Woo Sung, Suwon-si (KR); Won Kyu Jeung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 120 days.

(21) Appl. No.: 15/712,758

(22) Filed: Sep. 22, 2017

(65) Prior Publication Data

US 2018/0123553 A1    May 3, 2018

(30) Foreign Application Priority Data

Oct. 31, 2016  (KR) .................. 10-2016-0143690
Mar. 27, 2017  (KR) .................. 10-2017-0038523

(51) Int. Cl.
| | | |
|---|---|---|
| *H03H 9/10* | (2006.01) | |
| *H03H 9/54* | (2006.01) | |
| *H03H 9/60* | (2006.01) | |
| *H03H 9/58* | (2006.01) | |
| *H03H 9/02* | (2006.01) | |
| *H03H 9/17* | (2006.01) | |

(52) U.S. Cl.
CPC ...... *H03H 9/1014* (2013.01); *H03H 9/02007* (2013.01); *H03H 9/02157* (2013.01); *H03H 9/02818* (2013.01); *H03H 9/171* (2013.01); *H03H 9/542* (2013.01); *H03H 9/587* (2013.01); *H03H 9/605* (2013.01)

(58) Field of Classification Search
CPC .... H03H 9/1014; H03H 9/105; H03H 9/1071; H03H 9/1092; H03H 9/02007; H03H 9/605; H03H 9/587; H03H 9/542; H03H 9/02818; H03H 9/02157; H03H 9/171; H03H 2003/023; H03H 9/02015; H03H 9/02
USPC ..................... 333/133, 187, 188, 193–196
See application file for complete search history.

(56) References Cited

U.S. PATENT DOCUMENTS

| | | | |
|---|---|---|---|
| 2002/0014121 A1* | 2/2002 | Urabe ................ | H03H 9/1071 73/599 |
| 2004/0130411 A1* | 7/2004 | Beaudin ............ | H03H 9/14547 333/133 |
| 2008/0081398 A1 | 4/2008 | Lee et al. | |
| 2011/0227807 A1* | 9/2011 | Iwaki ................ | H03H 9/0571 343/850 |
| 2012/0028576 A1 | 2/2012 | Lo Hine Tong et al. | |

FOREIGN PATENT DOCUMENTS

| | | |
|---|---|---|
| JP | 3895397 B2 | 12/2006 |
| KR | 10-1659791 B1 | 9/2016 |

* cited by examiner

*Primary Examiner* — Robert J Pascal
*Assistant Examiner* — Jorge L Salazar, Jr.
(74) *Attorney, Agent, or Firm* — NSIP Law (57) ABSTRACT

A filter includes a multilayer structure having films configured as bulk acoustic wave resonators; a wiring line connected to the bulk acoustic wave resonators; a cap coupled to the multilayer structure on a bonding line; and the filtering characteristics of the filter being configured through a mutual inductance between the wiring line and the bonding line.

20 Claims, 7 Drawing Sheets

FILTER INCLUDING BULK ACOUSTIC WAVE RESONATOR

CROSS-REFERENCE TO RELATED APPLICATION(S)

This application claims benefit under 35 USC 119(a) of priority to Korean Patent Application Nos. 10-2016-0143690 filed on Oct. 31, 2016 and 10-2017-0038523 filed on Mar. 27, 2017 in the Korean Intellectual Property Office, the disclosure of which is incorporated herein by reference for all purposes.

BACKGROUND

1. Field

The present disclosure relates to a filter including a bulk acoustic wave resonator.

2. Description of Related Art

Recently, due to the rapid development of mobile communications devices, chemical and biological devices, and the like, demand for a smaller and lighter filter, oscillator, resonant element, acoustic resonant mass sensor, or the like, used in such devices, has also increased.

As a means of implementing such a small and light filter, oscillator, resonant element, and acoustic resonant mass sensor, a film bulk acoustic resonator (hereinafter, referred to as an "FBAR") is used. The FBAR may be mass-produced at a minimal cost, and may be implemented to have a subminiature size. In addition, the FBAR may be implemented to have a high-quality factor (Q) value, which is a main characteristic of a filter that may be used even in a microwave frequency band, and other bands of a personal communications system (PCS) and a digital cordless system (DCS).

In general, the FBAR includes a resonant part implemented by sequentially stacking a first electrode, a piezoelectric layer, and a second electrode on a substrate.

An operational principle of the FBAR will be described hereinafter. First, when electrical energy is applied to the first and second electrodes to induce an electric field in a piezoelectric layer, the electric field generates a piezoelectric phenomenon in the piezoelectric layer to allow the resonant part to vibrate in a predetermined direction. Resultantly, a bulk acoustic wave is generated in the same direction as the direction in which the resonant part vibrates, resulting in resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a filter comprises a multilayer structure having films configured as bulk acoustic wave resonators; a wiring line connected to the bulk acoustic wave resonators; a cap coupled to the multilayer structure on a bonding line; and the filtering characteristics of the filter being configured through a mutual inductance between the wiring line and the bonding line.

The bulk acoustic wave resonators may comprise a series resonator and a shunt resonator.

The filtering characteristics may be determined by the mutual inductance between inductance of the wiring line connected to the shunt resonator and inductance of the bonding line.

The mutual inductance may provide an inductor connected to the shunt resonator.

Inductance of the wiring line may be determined based on a length and an area of the wiring line.

Inductance of the bonding line may be determined based on a length and an area of the bonding line positioned at a predetermined distance from the wiring line.

The mutual inductance may be determined based on an inductance of the wiring line, an inductance of the bonding line, and a coupling coefficient between the inductance of the wiring line and the inductance of the bonding line.

The coupling coefficient may be determined based on a distance between the wiring line and the bonding line.

A position of a pole, determining a frequency band, may be changed based on the distance between the wiring line and the bonding line.

A gain and a frequency of a left pole, determining the frequency band, may be reduced as the distance between the wiring line and the bonding line is reduced.

In another general aspect, a filter comprises disposing series resonators between a signal input terminal and a signal output terminal; shunt resonators disposed between each of the series resonators and a ground; and an inductor disposed between one of the shunt resonators and the ground. The inductor is based on mutual inductance between a bonding line formed by a cap, accommodating the series resonators and the shunt resonators therein, and a wiring line connected to one of the shunt resonators.

The mutual inductance may be determined based on inductance of the wiring line, inductance of the bonding line, and a coupling coefficient between the inductance of the wiring line and the inductance of the bonding line.

The coupling coefficient may be determined based on a distance between the wiring line and the bonding line.

A position of a pole determining a frequency band may be changed depending on the distance between the wiring line and the bonding line.

A gain and a frequency of a left pole, determining the frequency band, may be reduced as the distance between the wiring line and the bonding line is reduced.

In another general aspect, a method to manufacture a filter comprises forming a multilayer structure comprising films configured as bulk acoustic wave resonators; forming a wiring line connected to the bulk acoustic wave resonators; forming a cap coupled to the multilayer structure on a bonding line; and determining and forming filtering characteristics of the filter based on mutual inductance between the wiring line and the bonding line.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
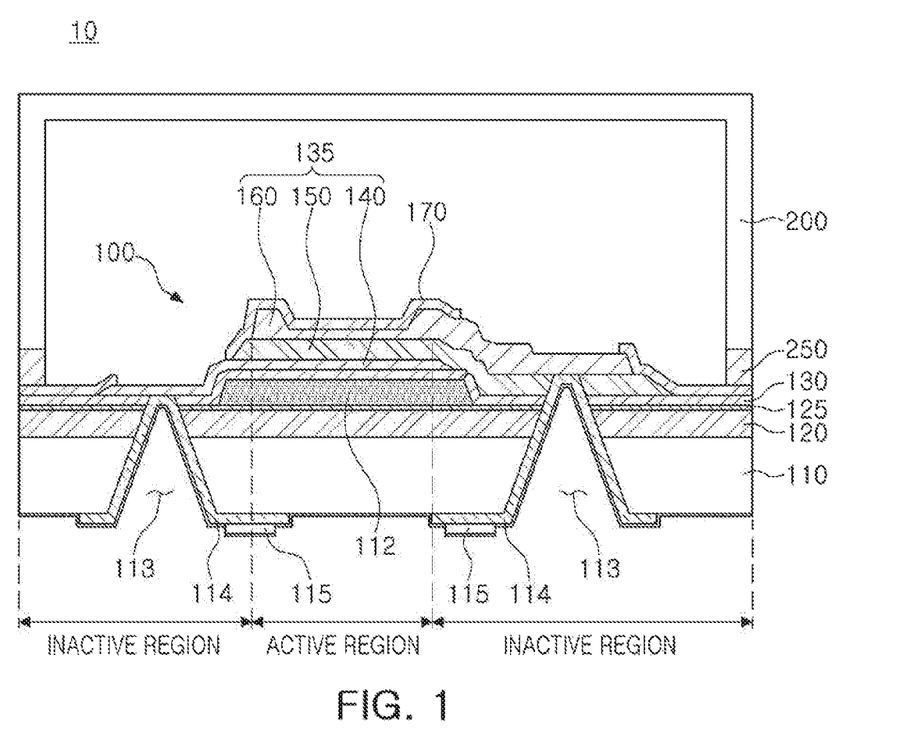
FIG. 1 is a cross-sectional view illustrating an example of a filter.

FIG. 1 is a cross-sectional view illustrating an examples of a filter.

Referring to FIG. 1, the filter 10 includes a bulk acoustic wave resonator 100 and a cap 200. The bulk acoustic wave resonator 100 is a film bulk acoustic resonator (FBAR).

The bulk acoustic wave resonator 100 is implemented by a multilayer structure including a plurality of films. The bulk acoustic wave resonator 100 includes a substrate 110, an insulating layer 120, an air cavity 112, and a resonant part 135.

The substrate 110 may be a general silicon substrate, and the insulating layer 120 electrically isolating the resonant part 135 from the substrate 110 is provided on an upper surface of the substrate 110. The insulating layer 120 is formed on the substrate 110 by performing chemical vapor deposition, radio frequency (RF) magnetron sputtering, or evaporation using one of silicon dioxide ($SiO_2$) or aluminum oxide ($Al_2O_3$).

The air cavity 112 is disposed on the insulating layer 120. The air cavity 112 is positioned below the resonant part 135 so that the resonant part 135 may vibrate in a predetermined direction. The air cavity 112 is formed by a process of forming an air cavity sacrificial layer pattern on the insulating layer 120, forming a membrane 130 on the air cavity sacrificial layer pattern, and then etching and removing the air cavity sacrificial layer pattern. The membrane 130 may serve as an oxidation protecting film, or may serve as a protecting layer protecting the substrate 110.

An etch stop layer 125 is additionally formed between the insulating layer 120 and the air cavity 112. The etch stop layer 125 may serve to protect the substrate 110 and the insulating layer 120 from an etching process, and may serve as a base required for depositing several different layers on the etch stop layer 125.

The resonant part 135 may include a first electrode 140, a piezoelectric layer 150, and a second electrode 160 sequentially stacked on the membrane 130. A common region in which the first electrode 140, the piezoelectric layer 150, and the second electrode 160 overlap with one another in a vertical direction are positioned above the air cavity 112. The first electrode 140 and the second electrode 160 may be formed of one of gold (Au), titanium (Ti), tantalum (Ta), molybdenum (Mo), ruthenium (Ru), platinum (Pt), tungsten (W), aluminum (Al), iridium (Ir), and nickel (Ni), or alloys thereof.

The piezoelectric layer 150, which generates a piezoelectric effect that electrical energy is converted into mechanical energy having an elastic wave form, may be formed of one of aluminum nitride (AlN), zinc oxide (ZnO), and lead zirconium titanium oxide (PZT; PbZrTiO). In addition, the piezoelectric layer 150 may further include a rare earth metal. As an example, the rare earth metal may include any one or any combination of scandium (Sc), erbium (Er), yttrium (Y), and lanthanum (La). The piezoelectric layer 150 may include 1 to 20 at % of rare earth metal.

A seed layer for improving crystal alignment of the piezoelectric layer 150 is additionally disposed below the first electrode 140. The seed layer may be formed of one of aluminum nitride (AlN), zinc oxide (ZnO), and lead zirconium titanium oxide (PZT; PbZrTiO) having the same crystallinity as that of the piezoelectric layer 150.

The resonant part 135 is divided into an active region and an inactive region. The active region of the resonant part 135, which is a region vibrating and resonating in a predetermined direction by a piezoelectric phenomenon generated in the piezoelectric layer 150 when electrical energy such as a radio frequency signal is applied to the first electrode 140 and the second electrode 160, may correspond to a region in which the first electrode 140, the piezoelectric layer 150, and the second electrode 160 overlap with one another in the vertical direction above the air cavity 112. The inactive region of the resonant part 135, which is a region that does not resonate by the piezoelectric phenomenon even through the electrical energy is applied to the first and second electrodes 140 and 160, may correspond to a region outside the active region.

The resonant part 135 may output a radio frequency signal having a specific frequency using the piezoelectric phenomenon. In detail, the resonant part 135 may output a radio frequency signal having a resonant frequency corresponding to vibrations depending on the piezoelectric phenomenon of the piezoelectric layer 150.

A protecting layer 170 is disposed on the second electrode 160 of the resonant part 135 to prevent the second electrode 160 from being externally exposed. The protecting layer 170 may be formed of any one or any combination of a silicon oxide based insulating material, a silicon nitride based insulating material, and an aluminum nitride based insulating material. A case in which one multilayer structure is accommodated in one cap 200 is illustrated in FIG. 1, but a plurality of multilayer structures may be accommodated in one cap 200, and may be connected to each other depending on a design. Here, the plurality of multilayer structures may include wiring electrodes provided on the first and second electrodes 140 and 160 externally exposed to thus be connected to each other.

The cap 200 is bonded to the multilayer structure, and may protect the resonant part 135 from an external environment. The cap 200 may have a cover form including an internal space in which the resonant part 135 is accommodated. In detail, the cap 200 may have an accommodating part formed in the center thereof so as to accommodate the resonant part 135 therein, and an edge of the cap 200 is stepped as compared to the accommodating part so that the cap 200 is coupled to the multilayer structure at the edge. The edge of the cap 200 is directly or indirectly bonded to the substrate 110 through an adhesive 250 in a specific region. A case in which the cap 200 is bonded to the protecting layer 170 stacked on the substrate 110 is illustrated in FIG. 1, but the cap 200 may penetrate through the protecting layer 170 and may then be bonded to at least one of the membrane 130, the etch stop layer 125, the insulating layer 120, and the substrate 110.

The cap 200 is bonded through wafer bonding in a wafer level. A substrate wafer in which a plurality of unit substrates 110 are disposed in a state in which they are coupled to one another and a cap wafer in which a plurality of caps 200 are disposed in a state in which they are coupled to one another may be bonded to each other, and may be diced subsequently through a dicing process to be separated into a plurality of individual bulk acoustic wave resonators illustrated in FIG. 1.

The cap 200 is bonded to the substrate 110 by eutectic bonding. In this case, the cap 200 is bonded to the substrate 110 by depositing the adhesive 250 that is eutectically bonded to the substrate 110 on the multilayer structure and then pressing and heating a substrate wafer and a cap wafer. The adhesive 250 may include a eutectic material of gold (Au)-tin (Sn), and may include a solder ball.

At least one via hole 113 penetrating through the substrate 110 in a thickness direction is formed in a lower surface of the substrate 110. The via hole 113 may penetrate through at least portions of the insulating layer 120, the etch stop layer 125, and the membrane 130 in the thickness direction, in addition to the substrate 110. A connection pattern 114 is formed in the via hole 113, and is formed over the entirety of an inner surface, that is, an inner wall, of the via hole 113.

The connection pattern 114 may be manufactured by forming a conductive layer on the inner surfaces of the via hole 113. For example, the connection pattern 114 is formed by depositing, applying, or filling a conductive metal such as gold or copper along the inner wall of the via hole 113. As an example, the connection pattern 114 is formed of an alloy of titanium (Ti)-copper (Cu).

The connection pattern 114 is connected to at least one of the first electrode 140 and the second electrode 160. As an example, the connection pattern 114 may penetrate through at least portions of the substrate 110, the membrane 130, the first electrode 140, and the piezoelectric layer 150, and be then electrically connected to at least one of the first electrode 140 and the second electrode 160. The connection pattern 114 formed on the inner surface of the via hole 113 is extended to the lower surface of the substrate 110 to be thus connected to a substrate connection pad 115 provided on the lower surface of the substrate 110. Therefore, the connection pattern 114 may electrically connect the first electrode 140 and the second electrode 160 to the substrate connection pad 115.

The substrate connection pad 115 is electrically connected to an external substrate that is disposed below the bulk acoustic wave resonator 100 through a bump. The bulk acoustic wave resonator 100 may perform a filtering operation of a radio frequency signal by a signal applied to the first and second electrodes 140 and 160 through the substrate connection pad 115.

Figure 2:
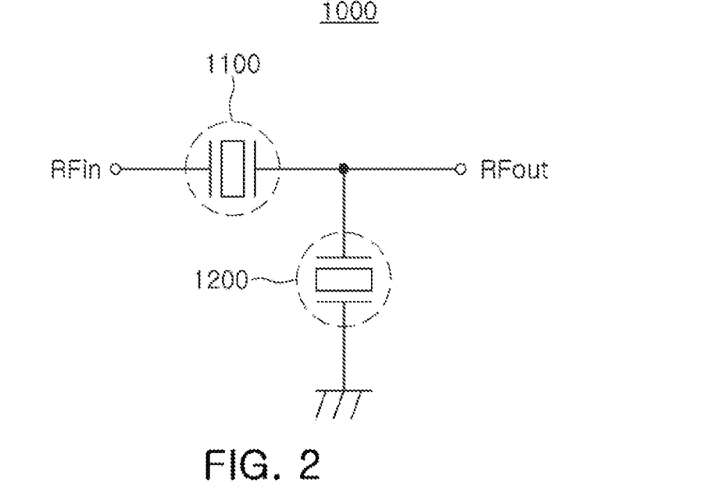
FIGS. 2 and 3 are schematic circuit diagrams illustrating examples of filters.
Figure 3:
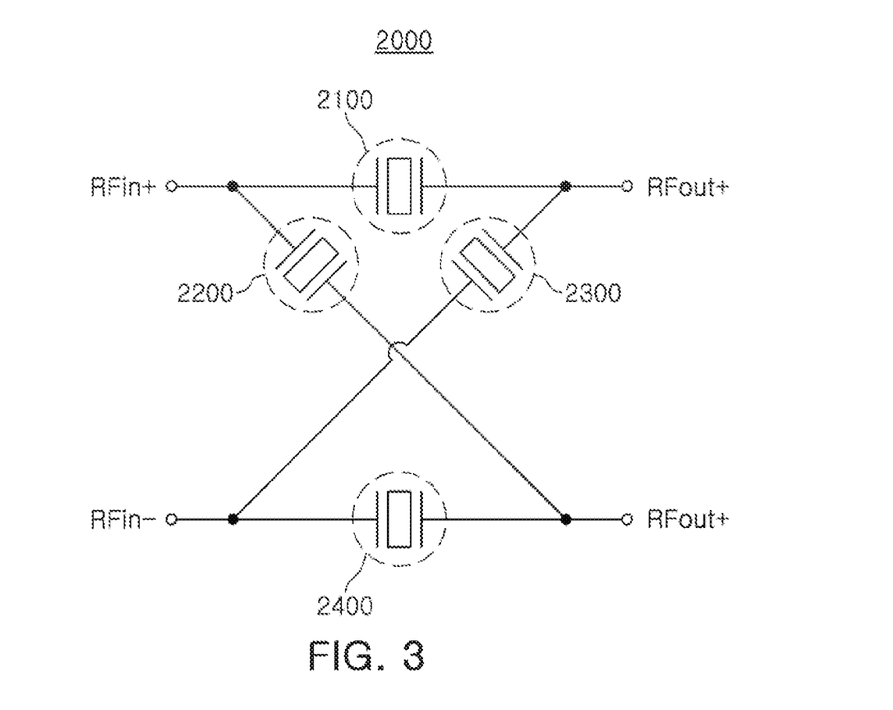

FIGS. 2 and 3 are schematic circuit diagrams illustrating filters according to exemplary embodiments in the present disclosure. A plurality of bulk acoustic wave resonators used in the filters of FIGS. 2 and 3 are formed by electrically connecting bulk acoustic wave resonators according to various examples in the present disclosure to each other.

Referring to FIG. 2, a filter 1000 is formed in a ladder type filter structure. In detail, the filter 1000 may include a plurality of bulk acoustic wave resonators 1100 and 1200.

A first bulk acoustic wave resonator 1100 is connected between a signal input terminal to which an input signal RFin is input and a signal output terminal from which an output signal RFout is output, in series, and a second bulk acoustic wave resonator 1200 is connected between the signal output terminal and a ground. Referring to FIG. 3, a filter 2000 according to another example in the present disclosure is formed in a lattice type filter structure. In detail, the filter 2000 may include a plurality of bulk acoustic wave resonators 2100, 2200, 2300, and 2400, and may filter balanced input signals RFin+ and RFin− and output balanced output signals RFout+ and RFout−.

The filters 1000 and 2000 illustrated in FIGS. 2 and 3 are configured by connecting inductors provided on the external substrate described above to each other, in addition to the bulk acoustic wave resonators 1100 and 1200, and 2100, 2200, 2300, and 2400. As an example, some of the bulk acoustic wave resonators are connected to the ground through the inductors provided on the external substrate, for the purpose of filtering of a designed frequency band.

In accordance with a demand for miniaturization and slimness of a filter, designs of the respective components of the filter tend to be minute and integrated. In such a trend, unintended mutual inductance components is generated between wiring lines and bonding lines designed and disposed adjacently to the bulk acoustic wave resonator, and inductances of the inductors provided on the external substrate deteriorate due to the generated mutual inductances.

Here, the wiring lines may correspond to signal lines such as the connection patterns, the wiring electrodes, and the like, described with reference to FIG. 1, and the bonding lines may correspond to a bonding region between the multilayer structure of the bulk acoustic wave resonator 100 and the cap 200.

In the filter according to the example in the present disclosure, the mutual inductances generated between the wiring lines of the bulk acoustic wave resonator 100 and the bonding lines between the multilayer structure of the bulk acoustic wave resonator 100 and the cap 200 are reflected in a circuit design to reduce or remove the inductances of the inductors provided on the external substrate, resulting in reduction of a cost required for manufacturing the filter and a volume of the filter.

Figure 4A:
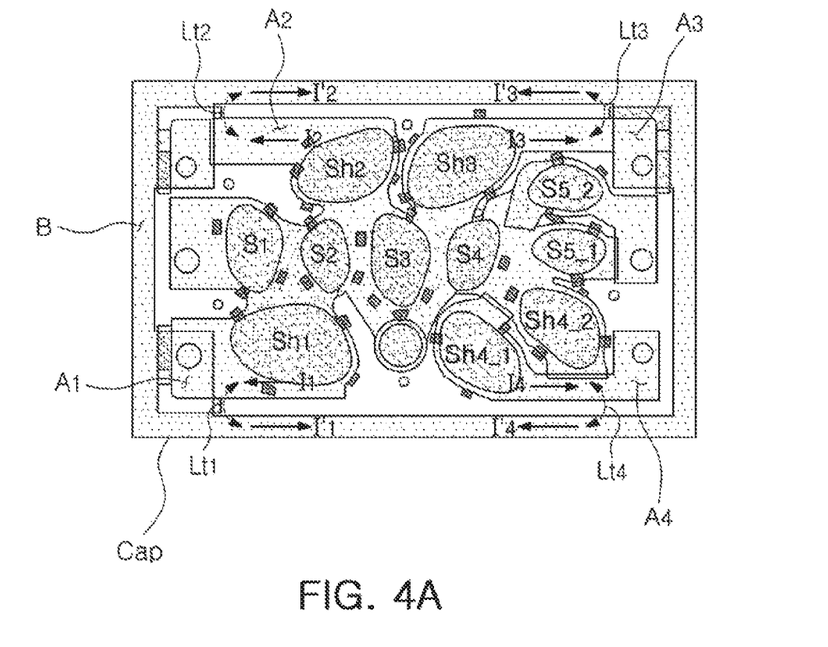
FIG. 4A is a top view illustrating the filter according to the example in the present disclosure.
Figure 4B:
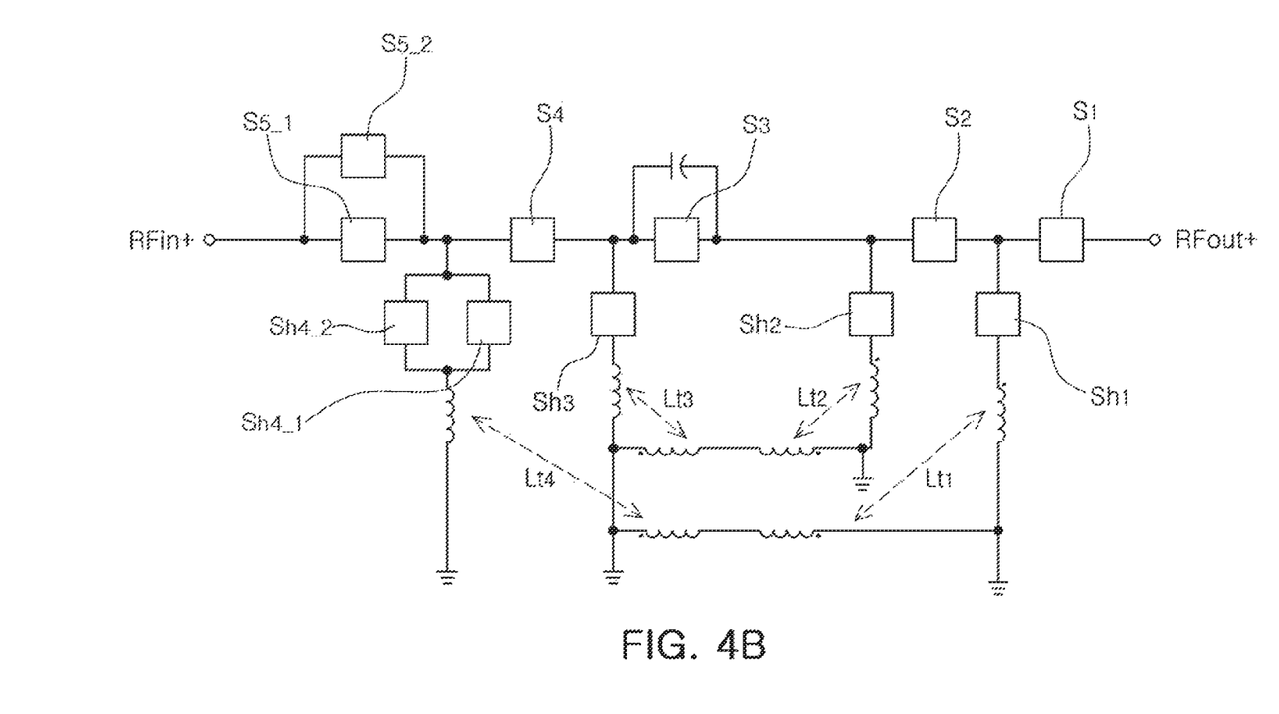
FIG. 4B is a circuit diagram according to an example.

FIG. 4A is a top view illustrating the filter according to an example in the present disclosure, and FIG. 4B is a circuit diagram according to an example in the present disclosure.

Referring to FIGS. 4A and 4B, the filters in the examples in the present disclosure may include one or more series resonators S1, S2, S3, S4, S5_1, S5_2, and one or more shunt resonators Sh1, Sh2, Sh3, Sh4_1, Sh_2. One or more series resonators S1, S2, S3, S4, S5_1, S5_2 and one or more shunt resonators Sh1, Sh2, Sh3, Sh4_1, Sh_2 are configured by the multilayer structure described above. The multilayer structure is accommodated by the cap 200, and the multilayer structure and the cap 200 is bonded to each other through the bonding lines.

One or more series resonators S1, S2, S3, S4, S5_1, S5_2 and one or more shunt resonators Sh1, Sh2, Sh3, Sh4_1, Sh_2 are electrically connected to the external substrate that are positioned below the filter through the wiring lines such as the connection patterns, the wiring electrodes, and the like.

Referring to FIG. 4A, wiring lines A1, A2, A3, and A4 connected to one or more shunt resonators Sh1 to Sh4 are disposed adjacently to bonding lines B, such that mutual inductances are generated between the wiring lines A1, A2, A3, and A4 and the bonding lines B. When currents I1, I2, I3, and I4 flow to the wiring lines A1, A2, A3, and A4 by the mutual inductances between the wiring lines A1, A2, A3, and A4 connected to one or more shunt resonators Sh1 to Sh4 and the bonding lines B, currents I'1, I'2, I'3, and I'4 flow to the bonding lines.

In the filter according to the example in the present disclosure, the mutual inductances between the wiring lines A1, A2, A3, and A4 connected to one or more shunt resonators Sh1 to Sh4 and the bonding lines B are reflected in a circuit design. Here, the mutual inductances between the wiring lines A1, A2, A3, and A4 connected to one or more shunt resonators Sh1 to Sh4 and the bonding lines B are equivalent to and represented by mutual inductors Lt1, Lt2, Lt3, and Lt4 of FIG. 4A.

Inductances of the mutual inductors Lt1, Lt2, Lt3, and Lt4 are determined depending on inductances of the wiring lines A1, A2, A3, and A4, inductances of the bonding lines B, and coupling coefficients between the inductances of the wiring lines A1, A2, A3, and A4 and the inductances of the bonding line B.

Here, the inductances of the wiring lines are determined by lengths and areas of the wiring lines A1, A2, A3, and A4, and the inductances of the bonding lines B are determined by lengths and areas of the bonding lines. As an example, the inductances of the bonding lines B are determined by lengths and areas of the bonding lines positioned in predetermined distances from the wiring lines A1, A2, A3, and A4. In addition, the coupling coefficients are determined depending on distances between the wiring lines A1, A2, A3, and A4 and the bonding lines B.

In the filter according to the example in the present disclosure, the inductances of the mutual inductors Lt1, Lt2, Lt3, and Lt4 are changed by adjusting at least one of the lengths and the areas of the wiring lines A1, A2, A3, and A4 and the bonding lines B and the distances between the wiring lines A1, A2, A3, and A4 and the bonding lines B. In addition, in the filter according to the example, the inductances of the mutual inductors Lt1, Lt2, Lt3, and Lt4 are changed to adjust filtering characteristics. As an example, a position of a pole determining a frequency band of the filter is adjusted.

FIGS. 5 through 9 are simulation graphs according to various examples in the present disclosure.

In FIGS. 5 through 9, graphs of radio frequency signals illustrated by dotted lines correspond to Comparative Examples, and graphs of radio frequency signals illustrated by solid lines correspond to Inventive Examples. In the Comparative Examples, it is assumed that bonding lines and wiring lines are spaced apart from each other sufficiently, such that inductances of the bonding lines and inductances of the wiring lines are not coupled to each other.

Table 1 is a table representing coupling coefficients K1, K2, K3, and K4 of mutual inductors Lt1, Lt2, Lt3, and Lt4 according to the Inventive Examples illustrated in FIGS. 5 through 9. In FIGS. 5 through 9, inductances L1, L2, L3, and L4 of the wiring lines were measured to be 0.3 nH, inductances L1', L2', L3', and L4' of the bonding lines were measured to be 0.5 nH, and the coupling coefficients K1, K2, K3, and K4 of the respective mutual inductors Lt1, Lt2, Lt3, and Lt4 of Table 1 were changed by adjusting the distances between the wiring lines and the bonding lines.

When the distances between the wiring lines and the bonding lines are short, the coupling coefficients K1, K2, K3, and K4 increase, and when the distances between the wiring lines and the bonding lines are long, the coupling coefficients K1, K2, K3, and K4 decrease. Therefore, it is understood that the intervals between the wiring lines and the bonding lines decease from FIG. 5 toward FIG. 9.

TABLE 1

Figure 5:
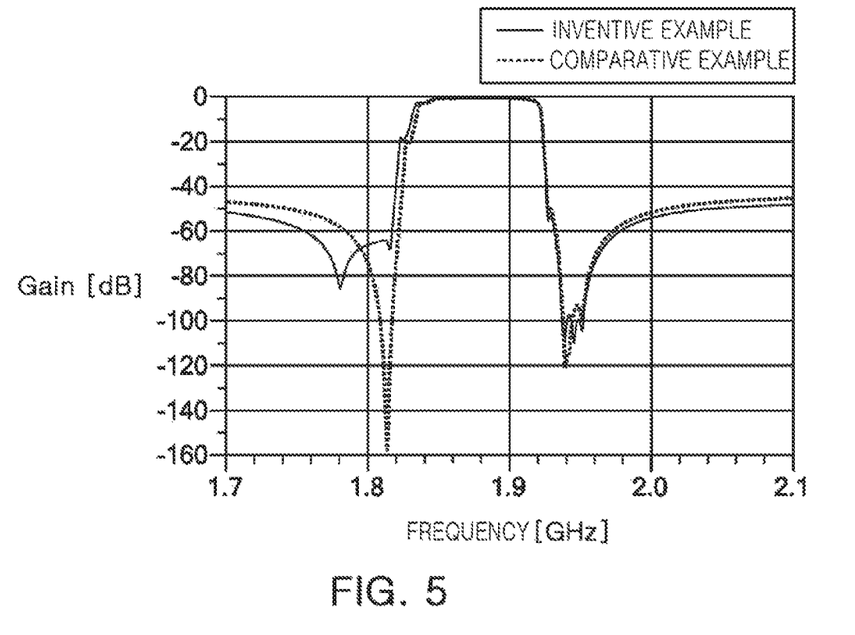
FIGS. 5 through 9 are simulation graphs according to various examples in the present disclosure.
Figure 6:
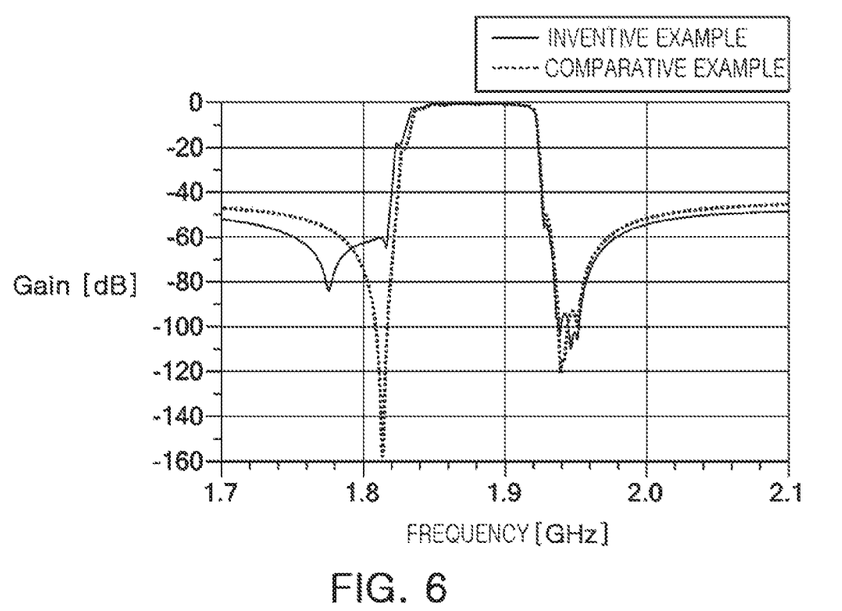
Figure 7:
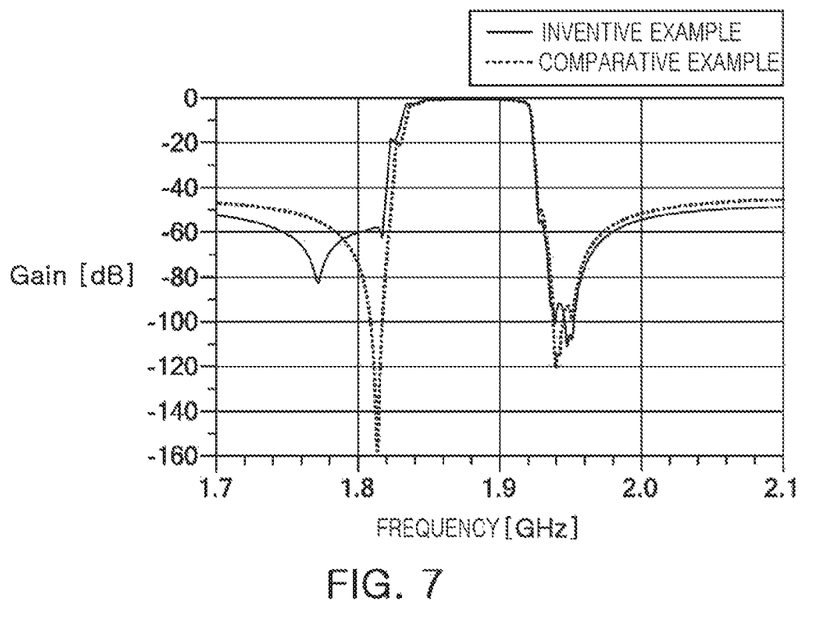
Figure 8:
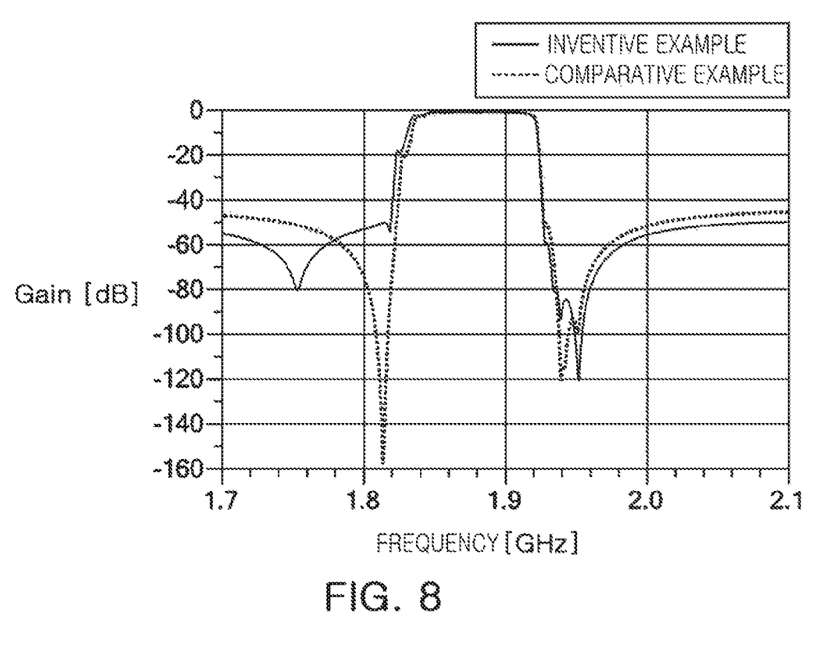
Figure 9:
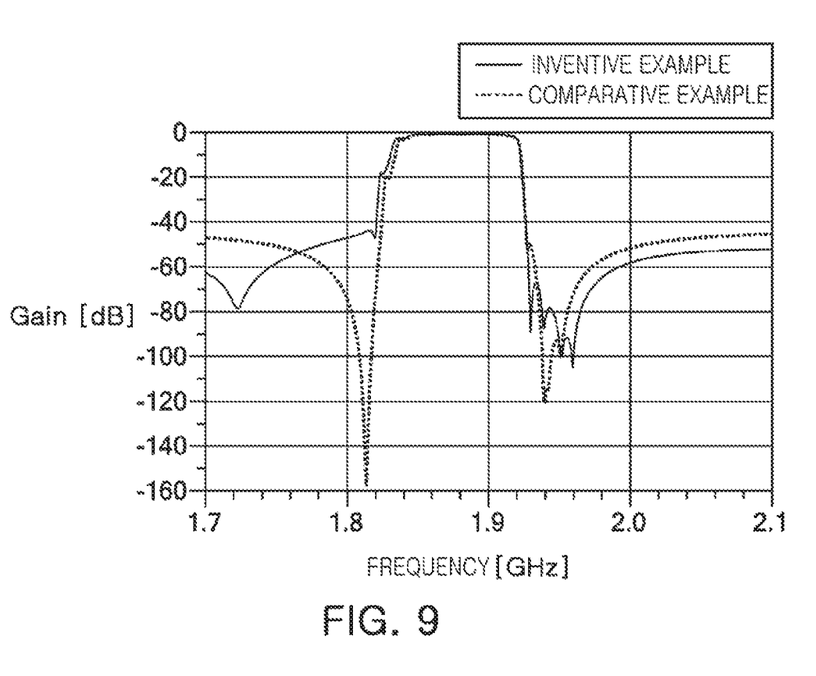

|        | K1   | K2   | K3   | K4   |
|--------|------|------|------|------|
| FIG. 5 | 0.1  | 0.1  | 0.1  | 0.1  |
| FIG. 6 | 0.1  | 0.1  | 0.15 | 0.15 |
| FIG. 7 | 0.15 | 0.15 | 0.15 | 0.15 |
| FIG. 8 | 0.3  | 0.3  | 0.15 | 0.15 |
| FIG. 9 | 0.3  | 0.3  | 0.3  | 0.3  |

As depicted in FIGS. 5 through 9, left poles of the Comparative Examples correspond to −160 dB at 1.815 GHz, a left pole of FIG. 5 of the Inventive Example corresponds to −85.6 dB at 1.781 GHz, a left pole of FIG. 6 of the Inventive Example corresponds to −84 dB at 1.776 GHz, a left pole of FIG. 7 of the Inventive Example corresponds to −82.5 dB at 1.769 GHz, a left pole of FIG. 8 of the Inventive Example correspond to −80.4 dB at 1.753 GHz, and a left pole of FIG. 9 of the Inventive Example corresponds to −78.8 dB at 1.723 GHz.

When comparing the Inventive Examples with the Comparative Examples, gains and frequencies of the left poles are reduced in the Inventive Examples as compared to the Comparative Examples in which the bonding lines and the wiring lines are spaced apart from each other sufficiently. In addition, it is confirmed that in the Inventive Examples of FIGS. 5 through 9, intervals between the bonding lines and the wiring lines decrease from FIG. 5 toward FIG. 9, such that the gains and the frequencies of the left poles gradually decrease.

That is, in the filter according to the examples in the present disclosure, the position of the pole determining the frequency band is adjusted by the coupling coefficients determined depending on the distances between the wiring liens and the bonding lines.

As set forth above, in the filter according to the examples in the present disclosure, the mutual inductance that may be generated between the bonding line and the wiring line may be reflected in the circuit design, resulting in the reduction in the cost required for manufacturing the filter and the volume of the filter.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter, comprising:
    a multilayer structure comprising films configured as bulk acoustic wave resonators;
    a wiring line connected to the bulk acoustic wave resonators; and
    a cap coupled to the multilayer structure on a bonding line,
    wherein filtering characteristics of the filter are configured through a mutual inductance between the wiring line and the bonding line, and a position of a pole, determining a frequency band, is changed based on the mutual inductance.

2. The filter of claim 1, wherein the bulk acoustic wave resonators comprise a series resonator and a shunt resonator.

3. The filter of claim 2, wherein the filtering characteristics are determined by the mutual inductance between inductance of the wiring line connected to the shunt resonator and inductance of the bonding line.

4. The filter of claim 3, wherein the mutual inductance provides an inductor connected to the shunt resonator.

5. The filter of claim 1, wherein inductance of the wiring line is determined based on a length and an area of the wiring line.

6. The filter of claim 1, wherein inductance of the bonding line is determined based on a length and an area of the bonding line positioned at a predetermined distance from the wiring line.

7. The filter of claim 1, wherein the mutual inductance is determined based on an inductance of the wiring line, an inductance of the bonding line, and a coupling coefficient between the inductance of the wiring line and the inductance of the bonding line.

8. The filter of claim 7, wherein the coupling coefficient is determined based on a distance between the wiring line and the bonding line.

9. The filter of claim 8, wherein the position of the pole is changed based on the distance between the wiring line and the bonding line.

10. The filter of claim 9, wherein a gain and a frequency of a left pole, determining the frequency band, are reduced as the distance between the wiring line and the bonding line is reduced.

11. A filter, comprising:
    series resonators disposed between a signal input terminal and a signal output terminal;
    shunt resonators disposed between each of the series resonators and a ground; and
    an inductor disposed between one of the shunt resonators and the ground,
    wherein the inductor is configured through a mutual inductance between a bonding line formed by a cap, accommodating the series resonators and the shunt resonators therein, and a wiring line connected to one of the shunt resonators, and
    wherein a position of a pole, determining a frequency band, is changed based on the mutual inductance.

12. The filter of claim 11, wherein the mutual inductance is determined based on an inductance of the wiring line, inductance of the bonding line, and a coupling coefficient between the inductance of the wiring line and the inductance of the bonding line.

13. The filter of claim 12, wherein the coupling coefficient is determined based on a distance between the wiring line and the bonding line.

14. The filter of claim 13, wherein the position of the pole is changed depending on the distance between the wiring line and the bonding line.

15. The filter of claim 14, wherein a gain and a frequency of a left pole, determining the frequency band, are reduced as the distance between the wiring line and the bonding line is reduced.

16. A method to manufacture a filter, comprising:
    forming a multilayer structure comprising films configured as bulk acoustic wave resonators;

forming a wiring line connected to the bulk acoustic wave resonators;

forming a cap coupled to the multilayer structure on a bonding line; and determining and forming filtering characteristics of the filter based on mutual inductance between the wiring line and the bonding line, wherein a position of a pole, determining a frequency band, is changed based on the mutual inductance.

17. The method of claim 16, wherein the bulk acoustic wave resonators comprise a series resonator and a shunt resonator.

18. The method of claim 16, wherein the filtering characteristics are determined by the mutual inductance between inductance of the wiring line connected to the shunt resonator and inductance of the bonding line.

19. The method of claim 18, wherein the mutual inductance provides an inductor connected to the shunt resonator.

20. The method of claim 19, wherein inductance of the wiring line is determined based on a length and an area of the wiring line.

* * * * *